United States Patent
Ono et al.

(10) Patent No.: US 11,889,665 B2
(45) Date of Patent: Jan. 30, 2024

(54) POWER CONVERTER

(71) Applicant: NISSAN MOTOR CO., LTD., Yokohama (JP)

(72) Inventors: Kimihiro Ono, Kanagawa (JP); Susumu Kumakura, Kanagawa (JP); Soichi Ishii, Kanagawa (JP)

(73) Assignee: NISSAN MOTOR CO., LTD., Yokohama (JP)

( * ) Notice: Subject to any disclaimer, the term of this patent is extended or adjusted under 35 U.S.C. 154(b) by 175 days.

(21) Appl. No.: 17/432,148

(22) PCT Filed: Feb. 21, 2019

(86) PCT No.: PCT/IB2019/000223
§ 371 (c)(1),
(2) Date: Aug. 19, 2021

(87) PCT Pub. No.: WO2020/170000
PCT Pub. Date: Aug. 27, 2020

(65) Prior Publication Data
US 2022/0174849 A1  Jun. 2, 2022

(51) Int. Cl.
| H05K 7/20 | (2006.01) |
| G01K 13/02 | (2021.01) |
| H02M 7/00 | (2006.01) |
| H05K 5/04 | (2006.01) |

(52) U.S. Cl.
CPC ......... *H05K 7/20927* (2013.01); *G01K 13/02* (2013.01); *H02M 7/003* (2013.01); *H05K 5/04* (2013.01)

(58) Field of Classification Search
None
See application file for complete search history.

(56) References Cited

U.S. PATENT DOCUMENTS

| 9,474,189 | B2* | 10/2016 | Kawauchi | .......... H05K 7/20436 |
| 9,693,446 | B2* | 6/2017 | Ragg | .................... H05K 1/0212 |
| 10,349,562 | B2* | 7/2019 | Kondo | ............... H05K 7/20945 |
| 10,667,439 | B1* | 5/2020 | Song | .................. H05K 7/14322 |

(Continued)

FOREIGN PATENT DOCUMENTS

| EP | 3385688 A1 | 10/2018 |
| JP | 59-17357 A | 1/1984 |

(Continued)

*Primary Examiner* — Courtney L Smith
(74) *Attorney, Agent, or Firm* — Foley & Lardner LLP

(57) ABSTRACT

A power converter comprising: a power conversion circuit to convert an input power into a direct current power or an alternating current power; a base member made of resin on which the power conversion circuit is mounted; a cover member, wherein the power conversion circuit is housed between the cover member and the base member; a coolant flow path provided in an interior of the base member, through which a coolant for cooling the power conversion circuit is circulated; and a temperature sensor provided on the base member, to sense the temperature of the coolant circulating through the coolant flow path, wherein the temperature sensor has a conductive member including at least a thermistor, and at least a part of the conductive member is surrounded by a resin wall formed of an insulating material.

12 Claims, 11 Drawing Sheets

(56) References Cited

U.S. PATENT DOCUMENTS

| | | | |
|---|---|---|---|
| 10,727,664 B2* | 7/2020 | Liu ................... | H03K 17/0828 |
| 11,316,440 B2* | 4/2022 | Kojima ................... | H01G 2/08 |
| 2018/0033720 A1* | 2/2018 | Tsukamoto ........... | H01L 23/538 |
| 2019/0173394 A1* | 6/2019 | Miura ................... | H02M 1/08 |
| 2019/0335607 A1* | 10/2019 | Song ................... | H05K 7/209 |

FOREIGN PATENT DOCUMENTS

| | | |
|---|---|---|
| JP | 04-337427 A | 11/1992 |
| JP | 2013-084800 A | 5/2013 |
| JP | 5471685 B | 4/2014 |
| WO | WO 2017/203984 A1 | 11/2017 |

* cited by examiner

COOLANT FLOW PATH (a)

(b)

POWER CONVERTER

TECHNICAL FIELD

The present invention relates to a power converter.

BACKGROUND ART

JP5471685B discloses a power converter which cools a semiconductor module by means of a coolant, wherein the power converter is configured to continuously monitor the temperature of the coolant by providing a temperature sensor at a cooling tube through which the coolant flows in order to control the temperature of the semiconductor module to be cooled.

SUMMARY OF INVENTION

Now, for the purpose to perform the accurate temperature control on the semiconductor module to be cooled, it is required to position the temperature sensor as close to the semiconductor module as possible. To satisfy this requirement, it is possible to position the temperature sensor in the interior of the power converter. However, when the temperature sensor is positioned in the interior of the power converter, because it is required to ensure a predetermined insulation distance between the electronic components and the temperature sensor which together constitute the power converter, there is the problem of increasing the size of the power converter.

The present invention is directed to provide a technique which can ensure the insulation between the electronic components and the temperature sensor which together constitute the power converter, when the power converter is positioned in the interior of the power converter without increasing the size of the power converter.

Embodiments of the present invention will be described in detail below with the accompanying figures.

The power converter according to one embodiments of present invention comprises a power conversion circuit to convert an input power into a direct current power or an alternating current power; a base member made of resin on which the power conversion circuit is mounted; a cover member, wherein the power conversion circuit is housed between the cover member and the base member; a coolant flow path provided in an interior of the base member, through which a coolant for cooling the power conversion circuit is circulated; and a temperature sensor provided on the base member, to sense the temperature of the coolant circulating through the coolant flow path. Wherein, the temperature sensor has a conductive member including at least a thermistor, and at least a part of the conductive member is surrounded by a resin wall formed of an insulating material.

DESCRIPTION OF EMBODIMENTS

First Embodiment

Figure 1:
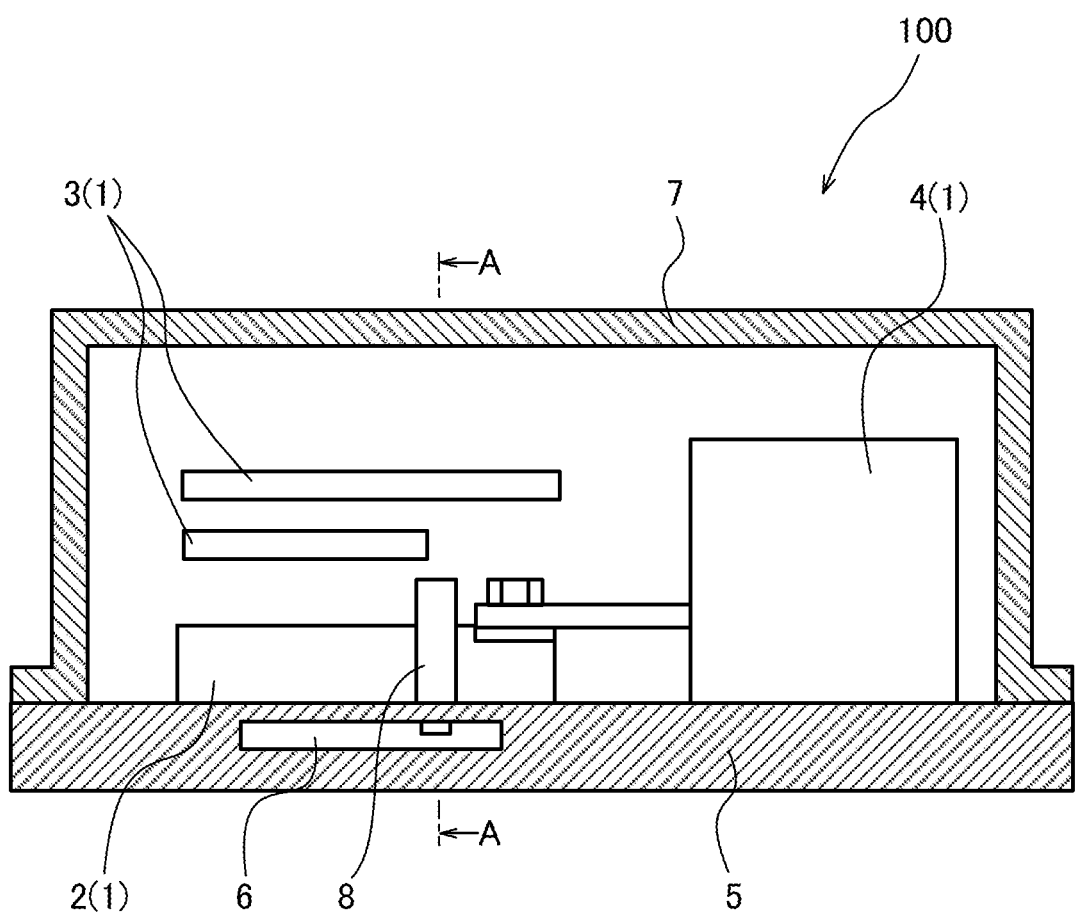
FIG. 1 is a diagram illustrating a power converter of FIRST EMBODIMENT.

FIG. 1 is a schematic configuration diagram illustrating a power converter 100 of the FIRST EMBODIMENT.

The power converter 100 comprises a power module 2, a control board 3, a smoothing capacitor 4, a base member 5 made of resin, a metal cover 7, and a temperature sensor 8. Also, the base member 5 comprises a coolant flow path 6 in the interior thereof, through which a coolant is able to circulate. The power converter 100 is mounted on a vehicle equipped with a motor for example and serves as an in-vehicle power converter which is a power supply means for the motor.

The power module 2, the control board 3, and the smoothing capacitor 4 are principally the electronic components necessary to convert an input power to a predetermined electric power to output it. An electrical circuit which is constituted by these electronic components is for example an inverter. Hereinafter, these electronic components will be collectively referred to as a power conversion circuit 1. The power conversion circuit 1 is electrically connected to an external power source via an electrical terminal (an input terminal, not shown) and is also connected to the motor (not shown) via another electrical terminal (an output terminal). Then, the power conversion circuit 1 converts the direct current power from the external power source described above to the alternating current power to provide the resulting power to the motor, or converts the alternating current power from the motor to the direct current power to provide the resulting power the external power source. In addition, at least the power module 2 among the various types of electronic components included in the power conversion circuit 1 in this embodiment is mounted on one side of the base member 5 (the top surface in this embodiment shown in FIG. 1), and secured to the base member 5 such as with a fixing bolt (not shown).

The base member 5 has a function as a cooling device to cool the power conversion circuit 1. The base member 5 is formed of an insulating material. The base member 5 in this embodiment is an electrically insulating resin, and in consideration of its strength, for example, such as polyphenylene sulfide (PPS) resin or polyphthalamide (PPA) resin is adopted.

The base member 5 comprises the coolant flow path (coolant conduit) 6 in the interior thereof, through which the coolant (for example, a cooling water) may be circulated. In this embodiment, for example, a Long-Life Coolant (LLC) is employed as the cooling water circulating through coolant flow path 6. The base member 5 cools the power conversion circuit 1 by the heat exchange between the power conversion circuit 1 (in particular, the power module 2) mounted on one side and the cooling water flowing through the coolant flow path 6 formed therein.

The temperature sensor (coolant temperature sensor) 8 is configured to sense (measure) the temperature of the coolant circulating through the coolant flow path 6 in the interior of the power converter 100. The power converter 100 then controls the temperature of the cooling water such that the temperature of the power conversion circuit 1 falls within the appropriate temperature range, on the basis of a sensed value from the temperature sensor 8. Further details of the temperature sensor 8 in this embodiment will be described with reference to FIGS. 2, 3, etc.

In the power conversion unit 100, the metal cover 7 serves as a housing which houses the power conversion circuit 1 and the temperature sensor 8 both of which are positioned between the metal cover 7 and the base member 5. The metal cover 7 in this embodiment is formed of any metal for example such as aluminum. The metal cover 7 has a recess and is secured to the top surface of the base member 5 such as with a fixing bolt (not shown) in a manner that the power conversion circuit 1 is housed within said recess. In this way, in the power converter 100 in this embodiment, the metal cover 7 and the base member 5 are configured to collectively serve as the housing which houses the power conversion circuit 1. Note that the base member 5 has not only the cooling function as described above, but also a function as a part of the housing which houses the power conversion circuit 1.

Now, with reference to FIGS. 9 to 11, the problem which the conventional power converter involves will be described.

Figure 9:
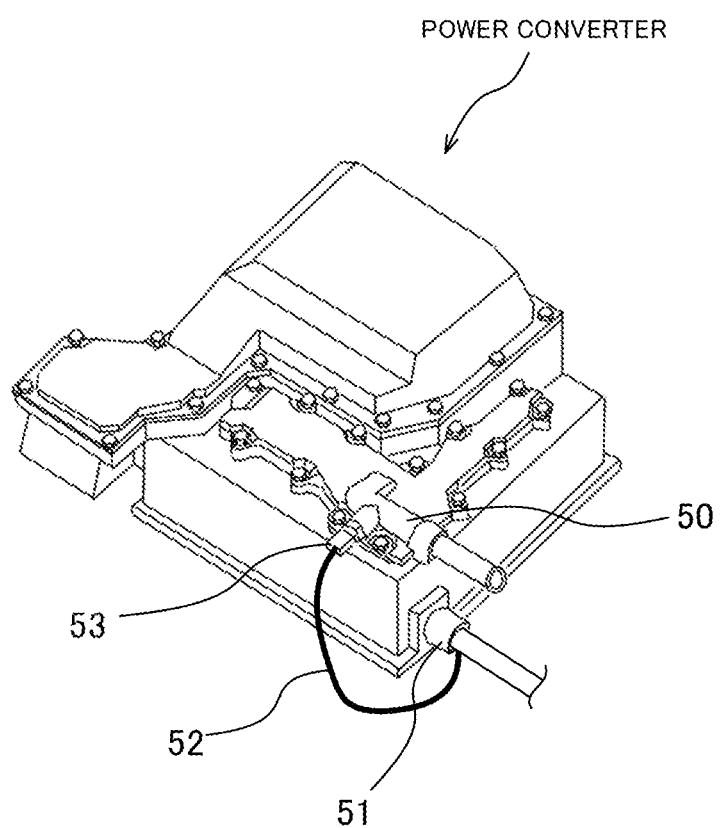
FIG. 9 is a perspective view illustrating a conventional power converter.

FIG. 9 is a perspective view illustrating an example of the conventional structure associated with the appearance of a power converter applied to an electric vehicle. The illustrated power converter comprises a waterway piping 50, a low power connector 51, an external low power wiring 52, and a temperature sensor 53. The waterway piping 50 is adapted to introduce a coolant from the exterior of the power converter to a coolant flow path formed in its interior, or to discharge the coolant from the interior to the exterior of the power converter.

As illustrated, in the conventional example associated with the power converter, the temperature sensor 53 is provided on the waterway piping 50 at the exterior of the power converter in order to avoid any risk of water leakage in the interior of the power converter, and configured to directly sense the temperature of the coolant circulating through the waterway piping 50. The data signal associated with the sensed temperature (water temperature) is transmitted, via the external low power wiring 52 and the low power connector 51, to a control board (not shown) positioned in the interior of the power converter. In this case, there is the problem that the accuracy of the temperature control on the power conversion circuit, which is performed on the basis of the temperature of the cooling water sensed by the temperature sensor, is decreased because the distance between the power conversion circuit to be cooled built in the power converter and the temperature sensor 53 is increased.

Further, positioning the temperature sensor 53 in the interior of the power converter also results in the problems as follows.

Figure 10:
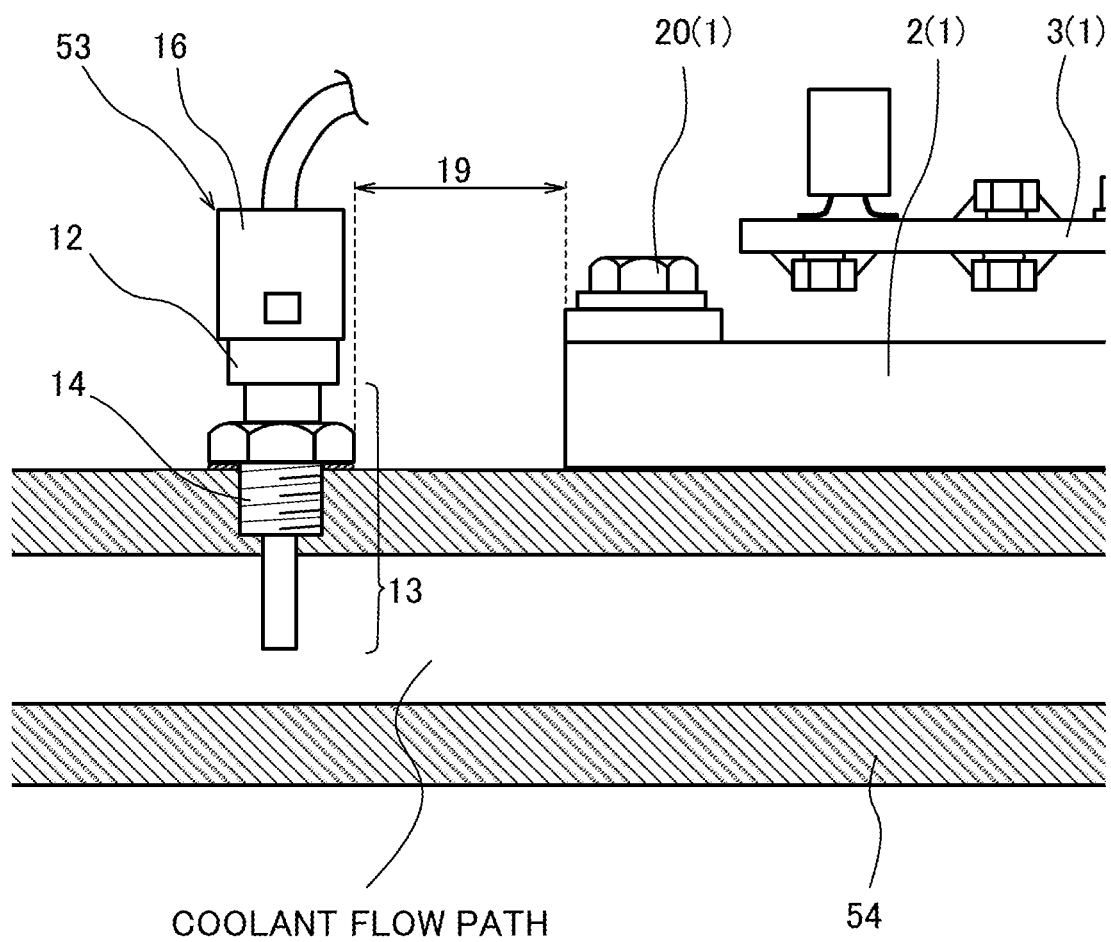
FIG. 10 is a diagram illustrating the conventional power converter.
Figure 11:
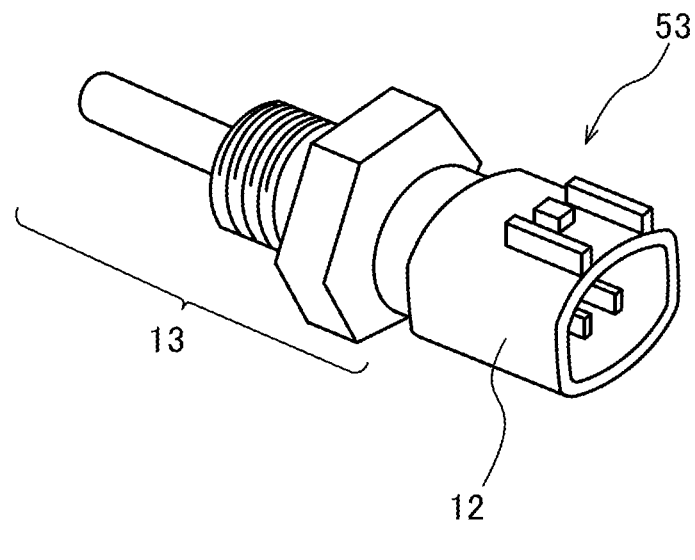
FIG. 11 is a diagram illustrating a conventional temperature sensor.
Figure 11:
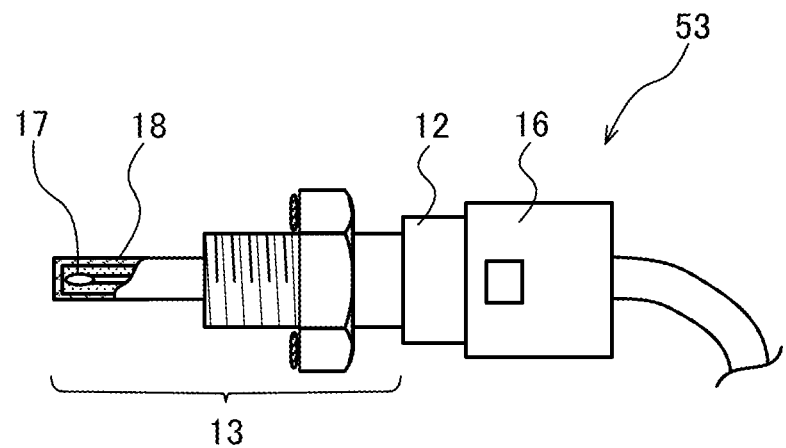

FIG. 10 is a diagram illustrating an example of the conventional structure associated with the interior of the power converter and illustrates the positional relationship between the temperature sensor 53 and the electronic components (collectively a power conversion circuit 1) built in the power converter. In the conventional example shown in this Figure, the power converter houses the power conversion circuit 1 comprising the power module 2, the control board 3, and a high-power element connection part 20, between a base member 54 which is made of metal and the metal cover 7 (not shown). The base member 54 is provided therein with a coolant flow path for circulating the coolant to cool the power conversion circuit 1. In addition, the temperature sensor 53 is configured to sense, in the interior of the power converter, the temperature of the coolant flowing through the coolant flow path.

Now, the structure of the conventional temperature sensor 53 will be described with reference to FIG. 11. FIG. 11 is a schematic configuration diagram illustrating an example of the conventional temperature sensor (temperature sensor 53). FIG. 11(*a*) is a perspective view illustrating an appearance of the temperature sensor 53. FIG. 11(*b*) is a diagram illustrating an interior structure of the temperature sensor 53. As shown in FIG. 11, the temperature sensor 53 comprises a male connector portion 12 and a metal housing portion 13. The metal housing portion 13 is composed of brass for example. Further, a thermistor 17, which is an electronic component whose resistance value is varied depending on the temperature change, is positioned in the interior space in the vicinity of the end (tip) on the tip side of the metal housing portion 13 (the opposite side of the male connector portion 12). Further, the internal space on the tip side of the metal housing portion 13 is filled with a heat transfer material (sealant) 18 composed of such as an epoxy material or grease so as to surround the thermistor 17. Then, the temperature sensor 53 is configured to be able to sense the temperature of the coolant circulating through the coolant flow path in response to the change of the resistance value of the thermistor 17, due to positioning at least the tip within the coolant flow path. The signal associated with the temperature change of the thermistor 17 is transmitted to the control board 3 via a female connector 16.

As shown in FIG. 10, in the conventional example, the temperature sensor 53 is positioned in the vicinity of the power conversion circuit in the interior of the power converter. However, because the conventional temperature sensor 53 has the metal housing portion 13 composed of an electric conductor such as brass, it is required to provide a predetermined inter-part distance necessary to ensure the insulation property for the conductive parts which constitute the power conversion circuit 1. Referring to FIG. 10, when the conventional temperature sensor 53 is positioned in the interior of the power converter, it is required to provide a predetermined inter-part distance 19 necessary to ensure the insulation property, between the temperature sensor 53 and the closest conductive part (in this example, the high-power element connection part 20) to the temperature sensor 53 among the conductive parts included in the power conversion circuit 1. As a result, conventionally, positioning the temperature sensor 53 in the interior of the power converter involves conventionally the problems that the size of the power converter increases in accordance with the predetermined inter-part distance 19.

The problems involved in the conventional power converter has been described above. In contrast to such conventional power converter, the power converter 100 according to the present invention can solve the conventional problems as described above. Hereinafter, the details of the power converter 100 according to the FIRST EMBODIMENT of the present invention will be described with reference to FIG. 2, etc.

Figure 2:
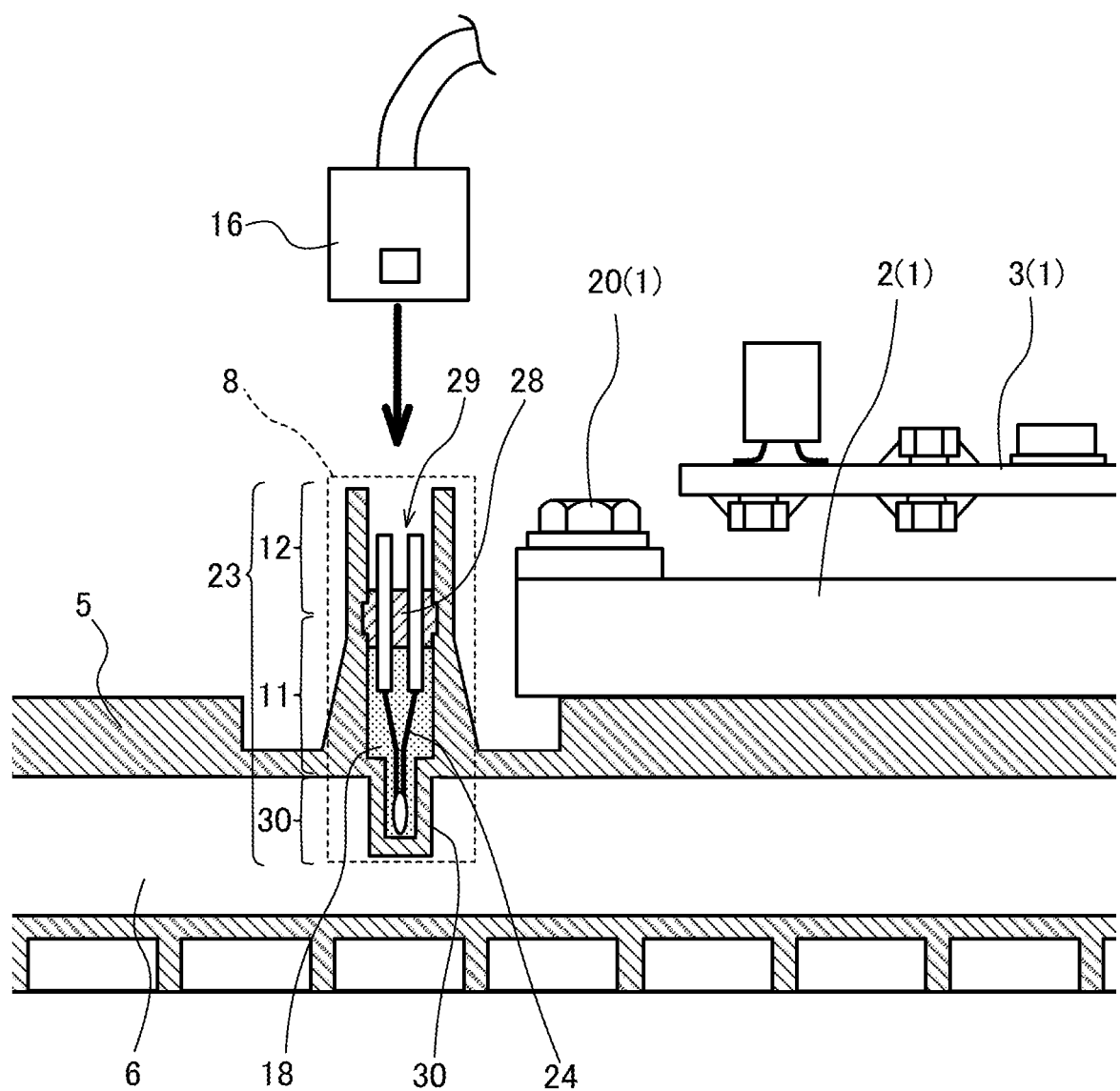
FIG. 2 is a sectional view taken along the line A-A of FIG. 1.

FIG. 2 is a sectional view taken along the line A-A of FIG. 1, illustrating the details of the temperature sensor 8 included in the power converter 100 of the FIRST EMBODIMENT.

The temperature sensor 8 comprises a sensor housing portion 23 and sub-parts 29 housed therein, as illustrated. Further, the sensor housing portion 23 comprises the male connector portion 12, a main body portion 11, and a projecting portion 30 which projects into the coolant flow path 6. Also, as illustrated, the sensor housing portion 23 which constitutes the temperature sensor 8 in this embodiment is integrally formed with the base member 5 made of resin.

Figure 3:
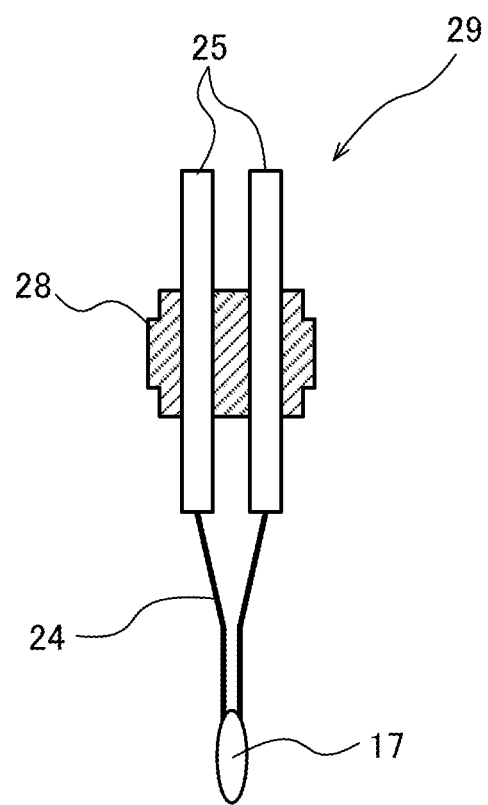
FIG. 3 is a diagram illustrating a sub-part.

FIG. 3 is a schematic configuration diagram illustrating an example configuration of the sub-parts 29. The sub-parts 29 comprise the thermistor 17, a lead wire 24, a signal terminal 25, and a resin cover 28. Note that the thermistor 17, the lead wire 24, and the signal terminal 25 construct the conductive member.

The thermistor 17 is an electronic component whose resistance value is varied depending on the temperature change. The signal associated with the resistance value of the thermistor 17, which varies depending on the temperature to be sensed, is transmitted to the control board 3 via the lead wire 24, the signal terminal 25, and the female connector 16 described below. In addition, the resin cover 28 is configured to hold the signal terminal 25 which is electrically connected to the thermistor 17 and the lead wire 24, and is configured to be held in place in the interior of the sensor housing portion 23.

Returning to FIG. 2, the temperature sensor 8 comprises the sensor housing portion 23 and the sub-parts 29, as described above. As illustrated, the sensor housing portion 23 (the male connector portion 12, the main body portion 11, and the projecting portion 30) is configured to be integral with the base member 5 made of resin. In other words, in the power converter 100 in this embodiment, the conductive member associated with the sub-parts 29 included in the temperature sensor 8 is configured to be surrounded by a resin wall formed by the insulating material. The resin wall is configured to act as the sensor housing portion 23 which is a part of the temperature sensor 8 and houses the sub-parts 29.

The sensor housing portion 23 in this embodiment comprises, in the space formed between the base member 5 and the metal cover 7 (see FIG. 1), a tubular (cylindrical-shaped) portion which is formed to project from one side of the base member 5 (in this embodiment, the same side as the side on which the power module 2 is mounted). The male connector portion 12, which is a tubular portion which is formed continuously from the main body portion 11, is formed to be able to fit with the female connector portion 16. The projecting portion 30 is a cylindrical portion, which is formed to project into the coolant flow path 6 formed in the interior of the base member 5, and has a space formed therein. This space is formed to be continuous to the tubular-shaped interior spaces of the male connector portion 12 and the main body portion 11.

Then, the sub-parts 29 are assembled to the continuous spaces in the interior of the male connector portion 12, the main body portion 11, and the projecting portion 30, which collectively constitute the sensor housing portion 23, thereby forming the temperature sensor 8.

The sub-parts 29 are preferably assembled such that the thermistor 17 is located in the internal space of the projecting portion 30 and the signal terminal 25 is located in the internal space of the male connector part 12. The sub-parts 29 in this embodiment, as illustrated, are assembled such that the thermistor 17 is located in the internal space of the projecting portion 30, a portion of the signal terminal 25, a portion of the resin cover 28, and the lead wire 24 are located in the internal space of the main body portion 11, and a portion of the signal terminal 25 on the side to be connected to the female connector 16 and a portion of the resin cover 28 are located in the internal space of the male connector portion 12. Thus, while the temperature sensor 8 in this embodiment is integrally formed with the base member 5, a tip portion (projecting portion 30) in which the thermistor 17 is housed is located within the coolant flow path 6 through which the coolant, whose temperature is to be sensed, is circulated and the signal associated with the measured temperature may be transmitted to the control board 3 via the female 16 fitted with the male connector portion 12.

Note that the respective boundaries of the male connector portion 12, the main body portion 11, and the projecting portion 30 in the sensor housing portion 23 are not be particularly defined. In this embodiment, as an example, the portion with a part capable of fitting with the female connector 16 at an end of the sensor housing portion 23 is referred to as the male connector portion 12, the portion projecting into the coolant flow path 6 on the other side of the sensor housing portion 23 is referred to as the projecting portion 30, and the portion between the male connector portion 12 and the projecting portion 30 with a rising part from the base member 5 on the same side as the side on which at least the power module 2 of the base member 5 is mounted is referred to as the main body portion 11.

Additionally, the internal spaces through the main body portion 11 and the projecting portion 30, in other words, the space in the temperature sensor 8, which is closer to the projecting portion than the resin cover 28 (the coolant flow path side), is filled with the heat transfer material 8. The heat transfer material 18 is a material with the thermal conductive property such as an epoxy material or grease (sealant). Thus, because the heat of the cooling water is more transmitted via the heat transfer material 18 in state where the projecting portion 30 and the cooling water are in contact with each other in the coolant flow path 6, the thermistor 17 can sense more adequately the temperature of the coolant.

Further, the shape of the projecting portion 30 may be set accordingly in view of its strength, etc. However, given that the strength is satisfactory, the projecting portion 30 is preferably formed to be as thin such that the temperature of the cooling water to the thermistor 17 is transmitted more accurately. Also, the projecting portion 30 is preferably formed so as to circulate the cooling water through the coolant flow path 6 with less resistance. For example, the projecting portion 30 may be formed into an ellipse shape, whose longitudinal axis may be arranged to be along the direction in which the cooling water flows.

Such configuration allows the temperature sensor 8 to sense, in the interior of the power converter 100, the temperature of the cooling water circulating through the coolant flow path 6 without any risk of the intrusion of the cooling water circulating through the coolant flow path 6 into the interior (the space between the base member 5 and the metal cover 7) of the power converter 100.

Further, because the conductive member included in the temperature sensor 8 such as the thermistor 17 and the signal terminal 25 are surrounded by the sensor housing portion 23 made of resin which is the insulating material, the insulation property between the electronic components positioned in the interior of the power converter 100 (particularly in the figures, the high power element connection part 20 of the power module 2) and the temperature sensor 8 can be ensured without providing the predetermined inter-part distance 19 (see FIG. 10). As a result, in the interior of the power converter 100, the temperature sensor 8 can be positioned in further vicinity of the power conversion circuit 1 including the power module 2, etc., without requiring the inter-part distance 19 for ensuring the insulation property, thereby allowing to improve the degree of freedom for the internal layout of the power converter 100 as well as to reduce the power converter 100 in size. Further, the temperature sensor 8 can be positioned in the vicinity of the power conversion circuit 1 whose temperature is to be controlled, thereby allowing to improve the accuracy of the temperature control on the power conversion circuit 1, which is performed on the basis of the cooling water temperature sensed by the temperature sensor 8. Still further, because the external low power wiring 52 shown in FIG. 9 is not required due to positioning the temperature sensor 8 in the interior of the power converter 100, the signal pins for the low power connector 51 and the manufacturing cost may be reduced.

The details of the power converter 100 of the FIRST EMBODIMENT has been described above. Hereinafter, the variations of the power converter 100 of the FIRST EMBODIMENT will be described below.

(Variation 1)

Figure 4:
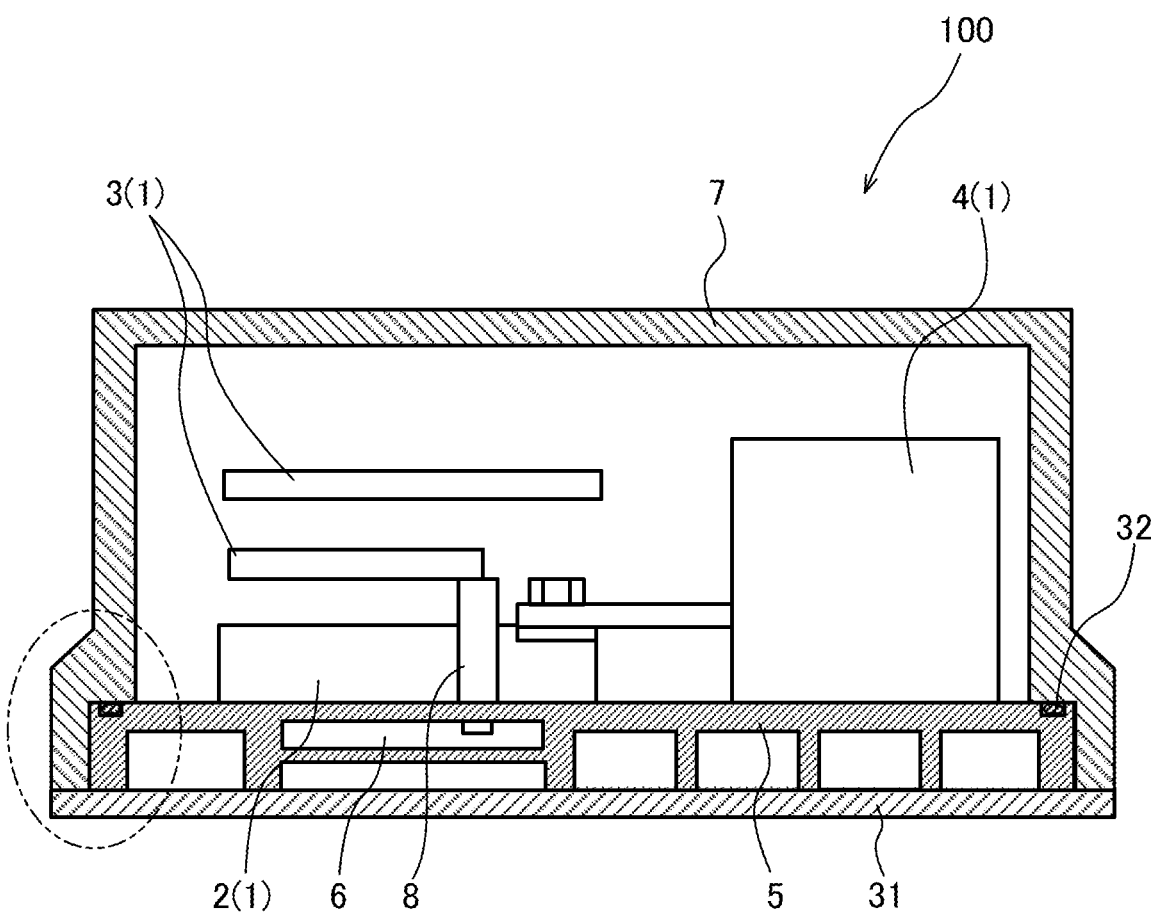
FIG. 4 is a diagram illustrating the VARIATION 1 of the power converter in the FIRST EMBODIMENT.

FIG. 4 is a diagram illustrating the VARIATION 1 of the power converter 100. The power converter 100 as described above comprises the base member 5 with the coolant flow path 6 as its foundation portion of the power converter 100, but the power converter 100 should not be limited to such configuration. The power converter 100 may be configured to be similar to the VARIATION 1 shown in FIG. 4.

In the VARIATION 1 shown in FIG. 4, a metal plate 31 made of any metal such as aluminum is positioned on the exterior of the base member 5. The metal plate 31 constitutes a part of the exterior package (housing) of the power converter 100 of the VARIATION 1 by being assembled with the metal cover 7. The way to assemble the metal plate 31 and the metal cover 7 will be described with reference to FIG. 5.

Figure 5:
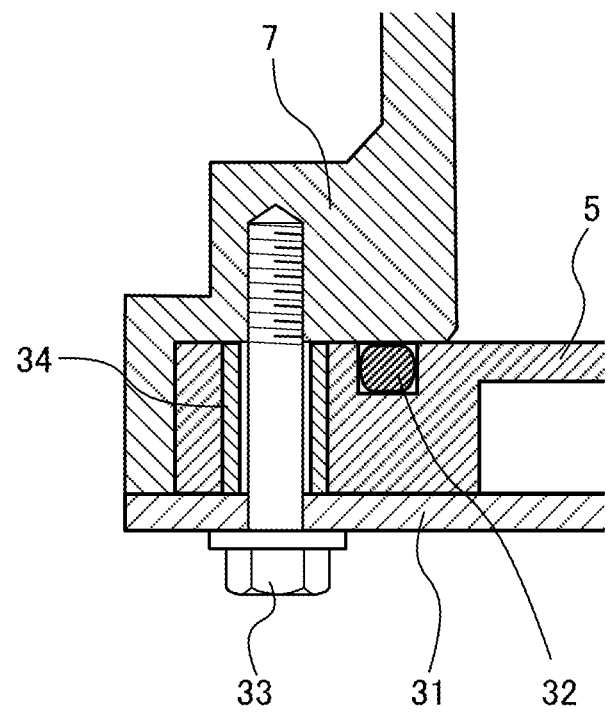
FIG. 5 illustrates a joining manner between a metal cover and a metal plate in the VARIATION 1.

FIG. 5 is a diagram illustrating an example of the way to assemble the metal cover 31 and the metal plate 7 together. FIG. 5 corresponds to the region specified by the double dashed line in FIG. 4.

The metal plate 31 and the metal cover 7 of the VARIATION 1 are fixed together with a bolt 33. At this time, the bolt 33 is inserted from the outside of the metal plate 31, penetrate a metal collar (spacer) portion 34 provided at the end of the base member 5, and is screwed into the metal cover 7 as illustrated. Thus, the base member 5 is secured between the metal plate 31 and the metal cover 7, as well as the power conversion circuit 1 including the power module 2, etc., which is mounted on the base member 5, is housed between the metal plate 31 and the metal cover 7. Such configuration of the power converter 100 allows the power converter 100 to ensure the EMC shielding performance on the power conversion circuit 1 housed therein due to the metal housing comprising the metal plate 31 and the metal cover 7. In addition, using any rubber material including a Nitrile butadiene rubber (NBR) or an Ethylene Propylene Diene Rubber (EPDM), or a liquid gasket (FIPG) for example as a seal member 32 between the base member 5 and the metal cover 7, the housing sealing performance of the power converter 100 also may be ensured.

(Variation 2)

Figure 6:
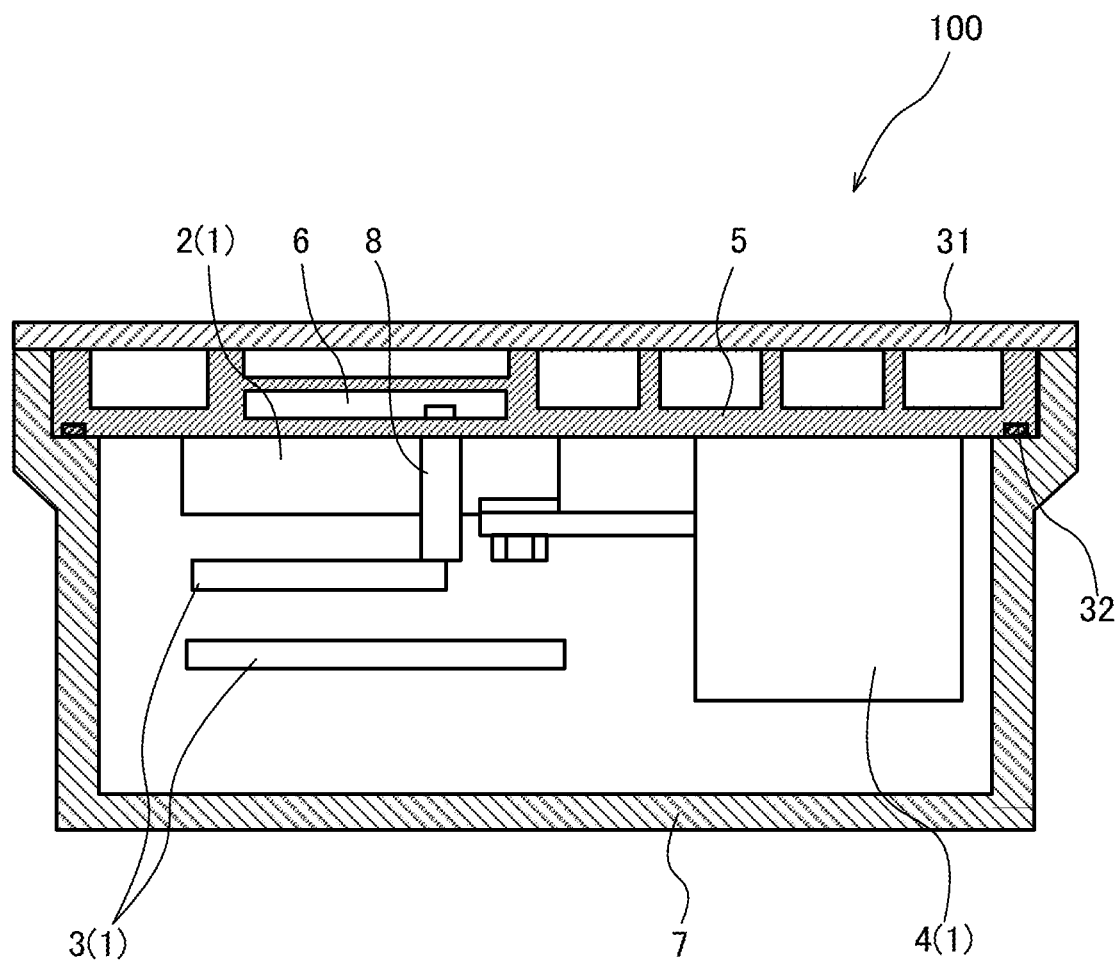
FIG. 6 is a diagram illustrating the VARIATION 2 of the power converter in the FIRST EMBODIMENT.

FIG. 6 is a diagram illustrating the VARIATION 2 of the power converter 100. The power converter 100 described above discloses the configuration in which the base member 5 is positioned in the lower region of the power converter 100 as its foundation portion, but the power converter 100 should not be limited to such configuration. The power converter 100 may be configured to be similar to the VARIATION 2 shown in FIG. 6.

In other words, the orientation (relative directions) along which the power converter 100 is mounted is not particularly limited, and the base member 5 can be positioned in the upper region, as shown in FIG. 6. In this way, for example, when the power converter 100 is applied to the electric vehicle, it can be freely positioned depending on the desired layout in the electric vehicle.

As described above, the power converter 100 according to the FIRST EMBODIMENT comprises the power conversion circuit 1 to convert the input power into the direct current power or the alternating current power, the base member 5 made of resin on which the power conversion circuit 1 is mounted, the cover 7 (cover member), wherein the power conversion circuit is housed between the cover member 7 and the base member 5, the coolant flow path 6 provided in the interior of the base member 5, through which the coolant for cooling the power conversion circuit 1 is circulated, and the temperature sensor 8 provided on the base member 5, to sense the temperature of the coolant circulating through the coolant flow path 6. The temperature sensor 8 has the conductive member including at least the thermistor 17, and at least a part of the conductive member are surrounded by the resin wall formed of the insulating material. Thus, because the conductive member included in the temperature sensor 8 is surrounded by the resin wall made of resin which is the insulating material, the insulation property between the electronic components positioned in the interior of the power converter 100 (the high-power element connection part 20 of the power module 2 as described above) and the temperature sensor 8 can be ensured without providing the predetermined inter-part distance 19 (see FIG. 10). As a result, the temperature sensor 8 can be positioned in the interior of the power converter 100 without increasing the size of the power converter 100.

Further, according to the power converter 100 of the FIRST EMBODIMENT 1, the resin wall is configured to act as the sensor housing portion 23 (housing portion) which is a part of the temperature sensor 8 and houses the conductive member (the signal terminal 25, the lead wire 24, and the thermistor 17), and the sensor housing portion 23 is integrally formed with the base member 5 made of resin. Thus, because in the sensor housing portion 23 of the temperature sensor 8, in particular, the portion projecting into the coolant flow path 6 (the projecting portion 30) is integrally formed with the base member 5, any risk of the intrusion of the cooling water circulating through the coolant flow path 6 into the interior of the power converter 100 may be eliminated. Also, because the conductive member included in the temperature sensor 8 are securely housed within the sensor housing portion 23 made of resin which is the insulating material, the insulation property between the electronic components positioned in the interior of the power converter 100 and the temperature sensor 8 can be ensured without requiring the predetermined inter-part distance 19 (see FIG. 10), and then the positioning location of the temperature sensor 8 can be closer to the power module 2.

Further, according to the power converter 100 of the FIRST EMBODIMENT, the sensor housing portion 23 has the projecting portion 30 which projects into the coolant flow path 6, and the thermistor 17 is housed within the projecting portion 30. Thus, because the distance between the thermistor 17 included in the temperature sensor 8 and the cooling water flowing through the coolant flow path 6 can be reduced as well as the contact area with the cooling water via the projecting portion 30 can be increased, the temperature of the cooling water can be sensed more accurately.

Second Embodiment

A power converter 200 in the SECOND EMBODIMENT will be described below.

Figure 7:
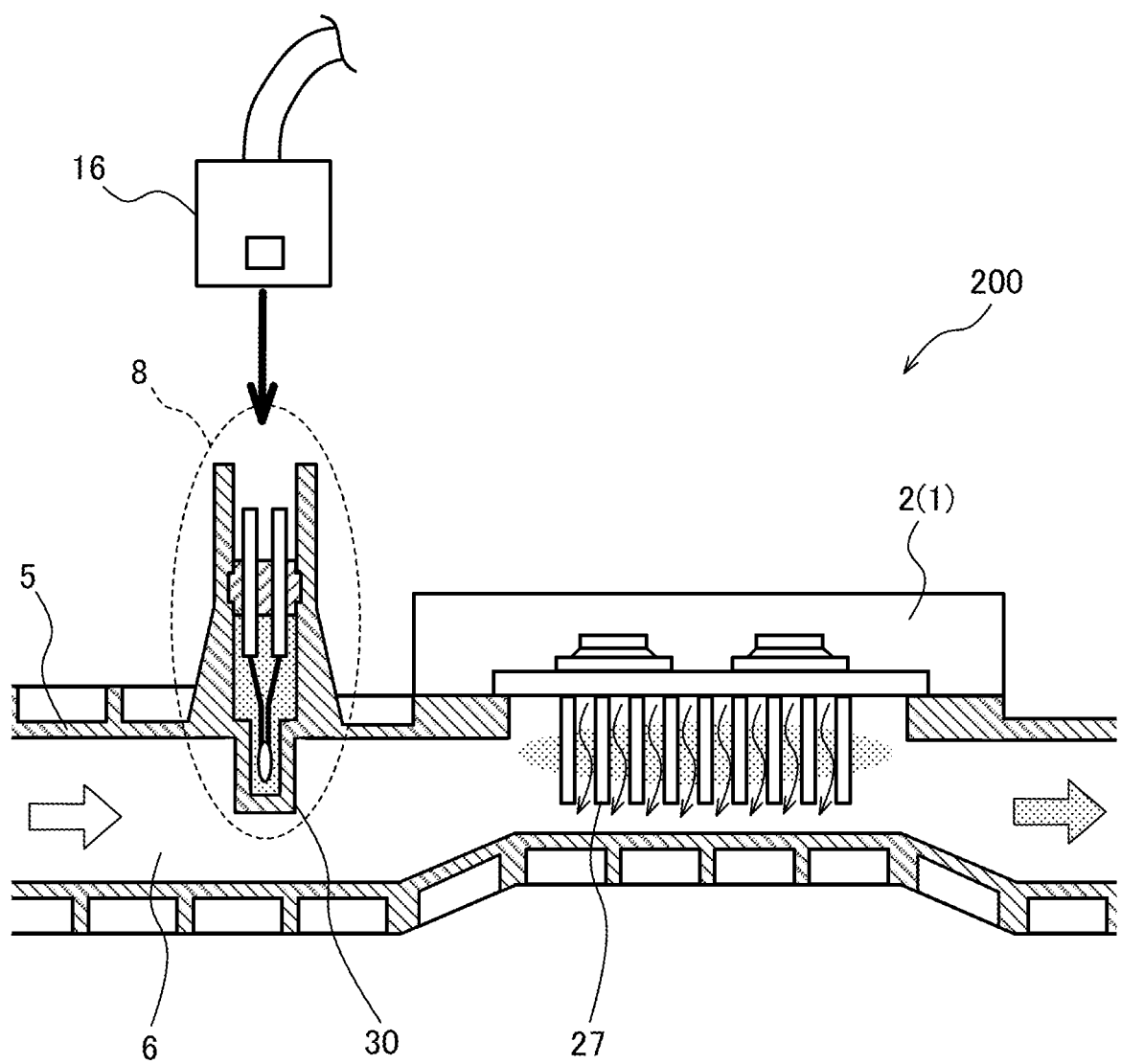
FIG. 7 is a diagram illustrating a power converter in the SECOND EMBODIMENT.

FIG. 7 is a diagram illustrating a configuration example of the power converter 200 in the SECOND EMBODIMENT, which is a schematic sectional view of the area corresponding to the A-A cross-section of FIG. 1. The power converter 200 in this embodiment is characterized by the location of the temperature sensor 8 in the interior of the power converter 200. Note that the arrows shown in FIG. 10 indicate a flowing direction of the cooling water through a coolant flow path 6.

Now, in the coolant flow path 6 for cooling the power module 2 housed in the power converter 200, the heat from the power module 2 causes to generate the heat flow in the cooling water flowing through the location where the power module 2 is positioned. As shown in FIG. 7, for example in this embodiment, heat radiating fins 27 for the purpose to improve the efficiency of the heat exchange between the power module 2 and the cooling water is provided in the coolant flow path 6 at the location where the power module 2 is positioned, and heat flows (see wavy arrows) with the power module 2 as the heat source is generated from the heat radiating fins.

Therefore, the temperature sensor 8 in the SECOND EMBODIMENT is positioned upstream of the location where the power module 2 is positioned in the coolant flow path 6 through which the cooling water for cooling the power module 2 flows. Thus, the temperature sensor 8 can measure more accurately the temperature of the cooling water flowing through the coolant flow path 6 without any effect of the heat flows due to the power module 2, thereby allowing to improve the accuracy of the temperature control on the power conversion circuit 1, which is performed on the basis of the cooling water temperature sensed by the temperature sensor 8.

As described above, according to the power converter 200 in the SECOND EMBODIMENT, the temperature sensor 8 is positioned upstream of the location where the power conversion circuit is positioned in the coolant flow path 6 provided in the interior of the base member 5. Thus, because the temperature of the cooling water flowing through the coolant flow path can be measured without any effect of the heat flows due to the power module 2, the cooling water can be measure more accurately, thereby allowing to improve the accuracy of the temperature control on the power conversion circuit 1, which is performed on the basis of the cooling water temperature sensed by the temperature sensor 8.

Third Embodiment

A power converter 300 in THIRD EMBODIMENT will be described below.

Figure 8:
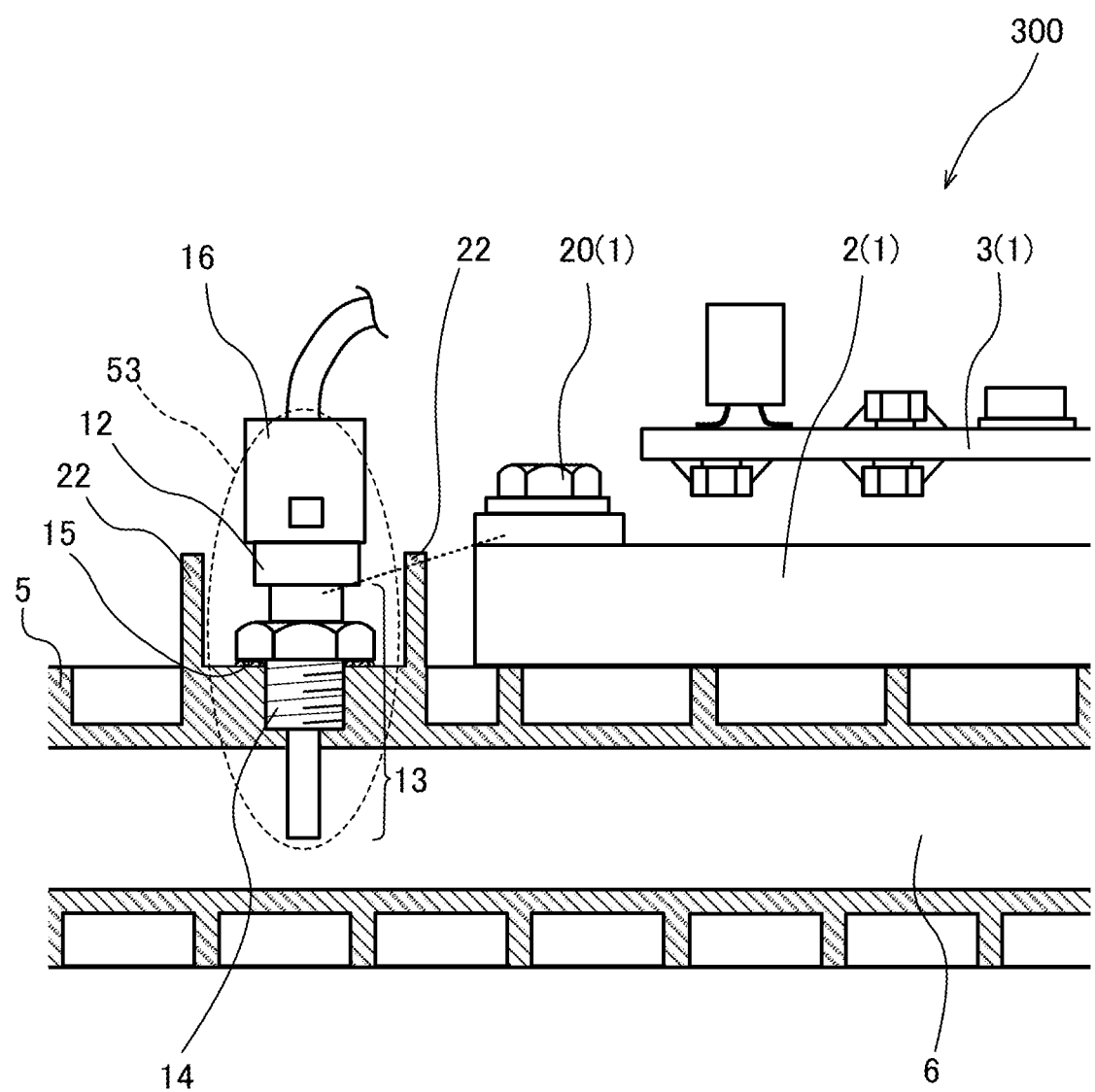
FIG. 8 is a diagram illustrating a power converter in THIRD EMBODIMENT.

FIG. 8 is a diagram illustrating a configuration example of the power converter 300 in THIRD EMBODIMENT, which is a schematic sectional view of the area corresponding to the A-A cross-section of FIG. 1. The power converter 300 is characterized in that the conventional temperature sensor 53 (see FIG. 10) is adopted as the temperature sensor to measure the temperature of the cooling water, and a resin wall 22 surrounding at least a portion of the temperature sensor 53 is provided.

Specifically, as shown in FIG. 8, the temperature sensor 53 in this embodiment is positioned in the vicinity of the power module 2 on the same side as the side on which the power module 2 of the base member 5 is mounted. The temperature sensor 53 is configured such that a portion in which at least the thermistor 17 is housed (see FIG. 11(b)) at the tip opposite to the male connector portion 12 of the metal housing portion 13, penetrates the base member 5 and projects into a coolant flow path 6.

In other words, the base member 5 in this embodiment comprises a through-hole that communicates with the coolant flow path 6 in the vicinity of the location where the power module 2 is mounted, and is configured such that the tip of the metal housing portion 13 of the temperature sensor 53 penetrates the through-hole and projects into the coolant flow path 6 when the temperature sensor 53 is mounted on the base member 5. Note that temperature sensor 53 is fixed such as by screwing a tap portion 14 provided in the metal housing portion 13 into the base member 5 in place.

In addition, when the temperature sensor 53 is fixed to the base member 5, its sealing performance is ensured by means of a sealing material 15. A rubber material such as a Nitrile butadiene rubber (NBR) or an Ethylene Propylene Diene Rubber (EPDM), or copper seal washer, etc. can be used as the sealing material 15.

Further, around the temperature sensor 53 in this embodiment, the resin wall 22 which is integrally configured (integrally formed) with the base member 5 is provided. The resin wall 22 is configured to surround at least the metal housing portion 13. The height of the resin wall 22 in this embodiment is set to be at least above the line (see the dotted line in FIG. 8) between the highest point of the metal housing portion 13 and the nearest portion to the metal housing portion 13 among the electronic components included in the power conversion circuit 1 (the high-power element connection part 20 of the power module 2 in this embodiment).

In this way, surrounding at least the metal housing portion 13 of the temperature sensor 53 by the resin wall 22 in the interior of the power converter 300 enables to ensure the insulation property between the electronic components included in the power conversion circuit 1 and the temperature sensor 53 without the predetermined inter-part distance 19 (see FIG. 19). As a result, in the interior of the power converter 300, the temperature sensor 53 can be positioned in the vicinity of the power conversion circuit 1 including the power module 2 without requiring the inter-part distance 19, thereby allowing to improve the accuracy of the temperature control on the power conversion circuit 1, which is performed on the basis of the temperature of the cooling water sensed by the temperature sensor 53, and allowing to reduce the power converter 300 in size. Still further, the external low power wiring 52 shown in FIG. 9 is not required due to positioning the temperature sensor 53 in the interior of the power converter 300, and then the signal pins for the low power connector 53 and the manufacturing cost may be reduced.

As described above, according to the power converter 300 in THIRD EMBODIMENT, the conductive member includes the metal housing portion 13 which houses the thermistor 17, and the temperature sensor 53 is configured such that the portion of the metal housing portion 13 penetrates the base member 5 and projects into the coolant flow path 6 with being mounted on the base material 5. Thus, because the metal housing portion 13 included in the temperature sensor 53 is surrounded by the resin wall 22 made of resin which is the insulating material, the insulation property between the electronic components positioned in the interior of the power converter 300 and the temperature sensor 53 can be ensured without providing the predetermined inter-part distance 19 (see FIG. 10). As a result, the temperature sensor 53 can be positioned in the interior of the power converter 300 without increasing the size of the power converter 300, thereby allowing the reduction of the power converter 300 in size than the conventional device.

While the embodiments and variations of the present inventions have been described above, the embodiments and variations illustrate simply some of the application examples of this invention, and the technical scope of this invention should not be limited thereto. This invention should not be limited to the described embodiments and variations and various modifications and applications may be implemented.

For example, the sensor housing portion 23 and the resin wall 22 both of which are integrally formed with the base member 5 as described above are not necessarily required to be integrally molded with the base member 5 with no seam (without joining). Each of the sensor housing 23 and the resin wall 22 and the base member 5 may be molded individually, and then joined together such as by means of the assembly adhesion and the mechanical joining.

Further, the shapes of the sensor housing portion 23, etc. are not limited to those illustrated in the figures. As long as they comprise the technical features described above, the shapes may be modified as required in view of the strength, etc.

The invention claimed is:

1. A power converter comprising:
a power conversion circuit configured to convert an input power into a direct current power or an alternating current power;
a base member made of resin on which the power conversion circuit is mounted, the base member being composed of an insulating material;
a cover member, wherein the power conversion circuit is housed between the cover member and the base member;
a coolant flow path provided within the base member, through which a coolant for cooling the power conversion circuit is circulated; and
a temperature sensor provided on the base member and configured to sense the temperature of the coolant circulating through the coolant flow path, wherein the temperature sensor has an electrically conductive member including comprising at least a thermistor; and
a resin wall that surrounds the electrically conductive member, wherein:
the electrically conductive member and the resin wall project from a side on which the power conversion circuit is mounted on the base member,
the temperature sensor is positioned in a vicinity of the power conversion circuit, and
the resin wall is configured to provide insulation between the power conversion circuit and the temperature sensor.

2. The power converter according to claim 1, wherein:
the resin wall is configured to act as a housing portion which is a part of the temperature sensor and houses the electrically conductive member, and
the housing portion is integrally formed with the base member made of resin.

3. The power converter according to claim 2, wherein:
the housing portion has a projecting portion which projects into the coolant flow path, and
the thermistor is housed within the projecting portion.

4. The power converter according to claim 1, wherein:
the electrically conductive member comprises a metal housing portion which houses the thermistor, and
the temperature sensor is configured such that a portion of the metal housing portion penetrates the base member and projects into the coolant flow path with being mounted on the base material.

5. The power converter according to claim 1, wherein:
the temperature sensor is positioned upstream of a location where the power conversion circuit is positioned in the coolant flow path provided in the interior of the base member.

6. A power converter comprising:
a power conversion circuit configured to convert an input power into a direct current power or an alternating current power;
a base member made of resin on which the power conversion circuit is mounted, the base member being composed of an insulating material;
a cover member, wherein the power conversion circuit is housed between the cover member and the base member;
a coolant flow path provided within the base member, through which a coolant for cooling the power conversion circuit is circulated; and
a temperature sensor provided on the base member and configured to sense the temperature of the coolant circulating through the coolant flow path, wherein the temperature sensor has an electrically conductive member comprising at least a thermistor; and
a resin wall that surrounds the conductive member and projects from a side of the base member on which the power conversion circuit is mounted, such that a portion of the resin wall is located between the electrically conductive member and the power conversion circuit.

7. The power converter according to claim 6, wherein:
the resin wall is configured to act as a housing portion which is a part of the temperature sensor and houses the electrically conductive member, and
the housing portion is integrally formed with the base member made of resin.

8. The power converter according to claim 7, wherein:
the housing portion has a projecting portion which projects into the coolant flow path, and
the thermistor is housed within the projecting portion.

9. The power converter according to claim 6, wherein:
the electrically conductive member comprises a metal housing portion which houses the thermistor, and
the temperature sensor is configured such that a portion of the metal housing portion penetrates the base member and projects into the coolant flow path with being mounted on the base material.

10. The power converter according to claim 6, wherein:
the temperature sensor is positioned upstream of a location where the power conversion circuit is positioned in the coolant flow path provided in the interior of the base member.

11. The power converter according to claim 6, wherein:
the resin wall surrounds an entirety of a periphery of the electrically conductive member.

12. A power converter comprising:
a power conversion circuit configured to convert an input power into a direct current power or an alternating current power;
a base member made of resin on which the power conversion circuit is mounted, the base member being composed of an insulating material;
a cover member, wherein the power conversion circuit is housed between the cover member and the base member;
a coolant flow path provided within the base member, through which a coolant for cooling the power conversion circuit is circulated; and
a temperature sensor provided on the base member and configured to sense the temperature of the coolant circulating through the coolant flow path, wherein the temperature sensor has an electrically conductive member comprising at least a thermistor; and
a resin wall that surrounds the electrically conductive member, wherein:
the electrically conductive member and the resin wall project from a side on which the power conversion circuit is mounted on the base member,
the electrically conductive member comprises a metal housing portion which houses the thermistor, and
the temperature sensor is configured such that a portion of the metal housing portion penetrates the base member and projects into the coolant flow path with being mounted on the base material.

* * * * *